(12) United States Patent
Bauer

(10) Patent No.: US 6,670,826 B1
(45) Date of Patent: Dec. 30, 2003

(54) CONFIGURABLE LOGIC BLOCK WITH A STORAGE ELEMENT CLOCKED BY A WRITE STROBE PULSE

(75) Inventor: Trevor J. Bauer, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 33 days.

(21) Appl. No.: 10/133,089

(22) Filed: Apr. 26, 2002

(51) Int. Cl.[7] .............................................. H03K 19/77
(52) U.S. Cl. ............................ 326/46; 326/39; 326/41
(58) Field of Search ............................ 326/38, 39, 40, 326/41, 46

(56) References Cited

U.S. PATENT DOCUMENTS 6,066,961 A * 5/2000 Lee et al. ..................... 326/39
6,107,827 A * 8/2000 Young et al. ................. 326/41

OTHER PUBLICATIONS

Xilinx, Inc.; "The Programmable Logic Data Book 2000"; published Apr. 2000; available from Xilinx, Inc., 2100 Logic Drive, San Jose, CA 95124; pp. 3–79 through 3–82.

* cited by examiner

Primary Examiner—Anh Tran
(74) Attorney, Agent, or Firm—Lois D. Cartier

(57) ABSTRACT

A configurable logic block for a programmable logic device includes a storage element having a latch clocked by a write strobe pulse. The storage element uses a write strobe signal and, optionally, a hold signal already present in the CLB. In one embodiment, the CLB includes a function generator, a write strobe generator providing hold and write strobe signals to the function generator, and a storage element driven by the function generator output signal and by the hold and write strobe signals from the write strobe generator. Because the CLB already includes a write strobe generator, it is not necessary to design additional logic to avoid race conditions in the storage element.

34 Claims, 6 Drawing Sheets

CONFIGURABLE LOGIC BLOCK WITH A STORAGE ELEMENT CLOCKED BY A WRITE STROBE PULSE

FIELD OF THE INVENTION

The invention relates to configurable logic blocks in programmable logic devices. More particularly, the invention relates to a configurable logic block including a storage element clocked by a write strobe pulse.

FIELD THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure. Some FPGAs also include additional logic blocks with special purposes (e.g., DLLS, RAM, and so forth).

The CLBs, IOBs, interconnect, and other logic blocks are typically programmed by loading a stream of configuration data into internal configuration memory cells that define how the CLBs, IOBs, and interconnect are configured. The configuration data may be read from memory (e.g., an external PROM) or written into the FPGA by an external device. The collective states of the individual memory cells then determine the function of the FPGA.

FIG. 1 is a simplified block diagram of a portion of a typical CLB. This structure is included, for example, in the CLBs of the Virtex™ FPGAs available from Xilinx, Inc. The Virtex CLB is described in pages 3–79 through 3–82 of "The Programmable Logic Data Book 2000", published April, 2000 and available from Xilinx, Inc., 2100 Logic Drive, San Jose, Calif. 95124, which pages are incorporated herein by reference.

As shown in FIG. 1, a typical CLB includes a function generator FG having n data input signals F(1:n). Function generator FG is often implemented, for example, as a 4-input lookup table (where n=4) containing data stored in configuration memory cells for the PLD. Thus, the lookup table provides any function of up to 4 inputs at output terminal FCN.

In advanced FPGAs such as the Virtex FPGA, the function generator can also be programmed to function as a RAM. To provide this capability, a write strobe generator WSG is also included in the CLB. Write strobe generator WSG accepts an input clock signal CK and provides a HOLD signal and a write strobe signal WS to function generator FG. (In the present specification, the same reference characters are used to refer to terminals, signal lines, and their corresponding signals.)

For example, in response to a rising edge on input clock signal CK, write strobe generator WSG drives signals HOLD and WS high, waits a sufficient time to accomplish a write to the function generator in RAM mode, brings write strobe signal WS low again, and finally brings the HOLD signal low. The HOLD signal must remain high after write strobe signal WS goes low, to prevent changes on the data input signals F(1:n) from reaching the RAM while write strobe signal WS is still active.

The typical CLB of FIG. 1 also includes another element, flip-flop FF. Flip-flop FF is a storage element that can be optionally included in the output path of the CLB. Flip-flop FF typically uses the same clock signal CK that drives write strobe generator WSG. The data input terminal IN of flip-flop FF is driven by the output signal FCN of function generator FG. The CLB output can be taken either from the flip-flop output XQ or directly from the FCN output terminal of function generator FG. Additional programmable data paths and elements are also commonly included in a CLB. These data paths and elements are not shown in FIG. 1, for clarity, but are well known in the art of PLD design.

FIG. 2 shows one implementation of flip-flop FF that is compatible with the CLB of FIG. 1. The flip-flop of FIG. 2 includes two latches (L1, L2), each including two cross-coupled inverters (203 and 204, 206 and 207, respectively). Data input signal IN is passed to latch L1 through passgate 202 when clock signal CK goes low. The data value from latch L1 is then passed to latch L2 through passgate 205 when clock signal CK goes high. Thus, in the flip-flop of FIG. 2 and given a change in the state of data input signal IN, the signal stored in latch L2 (D) changes state the next time clock signal CK changes from low to high.

Note that latched data signal D is twice inverted from data input signal IN, and thus has the same sense as that signal. Similarly, output signal OUT is twice inverted from latched data signal D (through inverters 208 and 209), and therefore also has the same sense as data input signal IN. Inverted latched data signal DB and inverted output signal OUTB have the opposite sense from data input signal IN.

There are many well-known variations on the flip-flop of FIG. 2. For example, an active-high reset signal can be added by replacing inverters 203 and 207 with 2-input NOR gates, of which the second input is the active-high reset signal. (When the reset signal goes high, the NOR output signals are forced low.) Similarly, an active-high set signal can be added by replacing inverters 204 and 206 with 2-input NOR gates, of which the second input is the active-high set signal. Active-low set and reset signals can be added by substituting 2-input NAND gates, rather than NOR gates, for the alternative inverters in each latch.

Another desirable variation involves the addition of initialization circuitry. An initialization circuit can cause the flip-flop to assume a predetermined state on receipt of an initialization signal. For example, the initialization can be performed by utilizing the set and reset circuitry previously described.

For initialization circuitry as well as with set and reset circuits, the desired result must be applied to both latches. If applied only to the first latch (e.g., L1), the output of the flip-flop is not initialized unless the clock signal CK is high. If applied only to the second latch (e.g., L2), the flip-flop only stays initialized as long as clock signal CK is low.

There are inherent drawbacks to the flip-flop of FIG. 2. One drawback is that it can be difficult to "trip" a latch while writing a new value to only one of the two nodes of the latch, particularly if passgate 202 is implemented as an N-channel transistor rather than a CMOS passgate. For example, to pass a new value to latch L1 of FIG. 2 (i.e., to place the new value on the output of inverter 203), the new value must overwrite an opposing value provided by the inverter. Therefore, careful circuit design is often required to successfully implement the circuit. This drawback can be overcome by placing another passgate on the feedback path (e.g., on the output of inverter 203), clocked by the inverse of the signals used to clock passgate 202. However, the addition of the new passgate for each of two latches increases the size of the flip-flop.

Another drawback to the flip-flop of FIG. 2 is not so easily overcome. The circuit is subject to several race conditions. Referring again to FIG. 2, for the circuit to function properly passgate 205 must turn off before passgate 202 turns on. However, passgate 202 should also turn off as soon as possible, to minimize the hold time of the circuit. If feedback passgates are used to make it easier to trip the latches, as described above, these passgates are also subject to race conditions.

While not a simple task, circuitry can be designed that achieves the desired result by ensuring that the correct clock signal wins the race in each instance. However, alterations to the circuit or to the circuit layout, or even to the fabrication process used to manufacture the device, can cause the race conditions to reappear and the modified flip-flop to malfunction.

This condition worsens as additional functionality is added to the flip-flop. The addition of set and/or reset circuitry and initialization capability can significantly alter the "race", compounding the problems described above.

FIG. 3 shows a second well-known flip-flop that is widely used in CLBs such as that shown in FIG. 1. The flip-flop of FIG. 3 includes two latches (L3, L4), each including an AND-NOR gate (364 and 367, respectively) and an inverter (363 and 366, respectively). The AND-NOR gates and inverters are cross-coupled in each latch. Data input signal IN is passed to latch L3 through AND-NOR gate 364 when clock signal CK goes low. The data value from latch L3 is then passed to latch L4 through AND-NOR gate 367 when clock signal CK goes high. Thus, the behavior of the two flip-flops pictured in FIGS. 2 and 3 is logically the same.

The flip-flop of FIG. 3 avoids the potential problems inherent in writing to a latch through a passgate (as in FIG. 2) by replacing the passgates with AND-NOR gates. However, the flip-flop of FIG. 3 consumes more area than that of FIG. 2, and, importantly, the race conditions inherent in the flip-flop of FIG. 2 are still present in the flip-flop of FIG. 3.

Therefore, it is desirable to provide a configurable logic block for a PLD having a storage element that lacks the multiplicity of race conditions prevalent in prior art flip-flops. It is further desirable to provide a storage element that can be easily modified to include set, reset, and/or initialization functions, while minimizing the additional area and design complexity required to implement these additional functions.

SUMMARY OF THE INVENTION

The invention provides a configurable logic block for a PLD that includes a storage element having a latch circuit clocked by a write strobe pulse. The storage element uses a strobe signal already present in the CLB. Therefore, it is not necessary to design additional complicated logic to avoid race conditions in the storage element. Because the set, reset, and initialization circuitry is applied to only one latch, this functionality can be added with minimal impact on the size and complexity of the circuit. Further, because new data is written simultaneously to both nodes in the latch circuit, the data already present in the latch circuit is easily overwritten.

According to one embodiment, the invention provides a first CLB including a function generator, a write strobe generator providing a write strobe signal and an optional hold signal to the function generator, and a storage element driven by the function generator output signal and by the hold and write strobe signals from the write strobe generator. In one embodiment, the storage element includes a data input terminal coupled to an optional hold circuit, which is in turn coupled to an internal node. If included, the hold circuit has a control terminal coupled to receive the hold signal from the write strobe generator. Coupled to the internal node is a data transfer circuit, which is in turn coupled to two input nodes of a latch circuit. The data transfer circuit has a control terminal responsive to the write strobe signal from the write strobe generator, and transfers data from the internal node to the latch circuit. The latch circuit has two input terminals by which it receives data from the data transfer circuit, and also two output terminals, at least one of which supplies data to an output terminal of the storage element.

In some embodiments, the latch circuit includes two cross-coupled inverters. In other embodiments, the latch circuit includes two cross-coupled logic gates other than inverters, such as NAND gates or NOR gates. A second input to each of these logic gates can be a set, reset, or initialization signal from corresponding set, reset, or initialization circuits.

Other embodiments of the invention include an output circuit coupled to one or more of the output terminals of the latch circuit, and/or a capture circuit coupled to the initialization circuit and to the data output terminal of the storage element.

In one embodiment, the initialization circuit includes a PLD configuration memory cell in which the initialization value for the storage element is stored. In other embodiments, a programmable input inversion circuit is coupled between the data input terminal and the hold circuit. The input inversion circuit can be, for example, a multiplexer programmably selecting between inverted and non-inverted versions of a signal on the data input terminal.

According to another embodiment, the invention provides a second CLB including a function generator, a write strobe generator providing a write strobe signal and an optional hold signal to the function generator, and a storage element driven by the function generator output signal and by the hold and write strobe signals from the write strobe generator. In this embodiment, the storage element has a data input terminal coupled to a passgate, which is in turn coupled to an input terminal of a first inverter. A gate terminal of the passgate is coupled to a hold input terminal, which is coupled to receive the hold signal from the write strobe generator. An output terminal of the first inverter is coupled to an input terminal of a second inverter. The first and second inverters drive second and first cross-coupled logic gates, respectively, through two transistors. Each of the two transistors has a gate terminal coupled to a write strobe input terminal, which is coupled to receive the write strobe signal from the write strobe generator. At least one of the two cross-coupled logic gates drives a data output terminal for the storage element.

In some embodiments, the first and second logic gates are inverters. In other embodiments, the first and second logic gates are logic gates other than inverters, such as NAND gates or NOR gates. A second input to each of these logic gates can be a set, reset, or initialization signal from corresponding set, reset, or initialization circuits.

Other embodiments of the invention include a third inverter coupled to the output terminal of one of the first and second logic gates, the third inverter driving the data output terminal of the storage element, and/or a capture circuit coupled to the initialization circuit and to the data output terminal of the storage element.

According to yet another embodiment, the invention provides a third CLB including a function generator, a write strobe generator providing a write strobe signal and an optional hold signal to the function generator, and a storage element driven by the function generator output signal and by the hold and write strobe signals from the write strobe generator. In this embodiment, the storage element includes: a data input terminal; an internal node; a latch circuit; optional means for passing a data input value on the data input terminal to the internal node when a signal on a hold input terminal is in a first predetermined state; and means for passing a data input value on the internal node to the latch circuit when a signal on a write strobe input terminal is in a second predetermined state.

The latch circuit has two latch input terminals and two latch output terminals. Data is passed to the two latch input terminals from the internal node by passing the data input value to a first latch input terminal and an inverse of the data input value to a second latch input terminal. At least one of the two latch output terminals drives an output terminal for the storage element.

Other embodiments include means for setting the latch circuit; means for resetting the latch circuit; means for initializing the latch circuit to a predetermined value; and/or means for capturing the predetermined value on the data output terminal of the storage element.

According to another embodiment, the invention provides a PLD including an array of configurable logic blocks (CLBs). Each CLB includes a programmable function generator, a write strobe generator, and a storage element. The write strobe generator has a write strobe output terminal and an optional hold output terminal, each of which is coupled to respective input terminals of the function generator and the storage element.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 4:
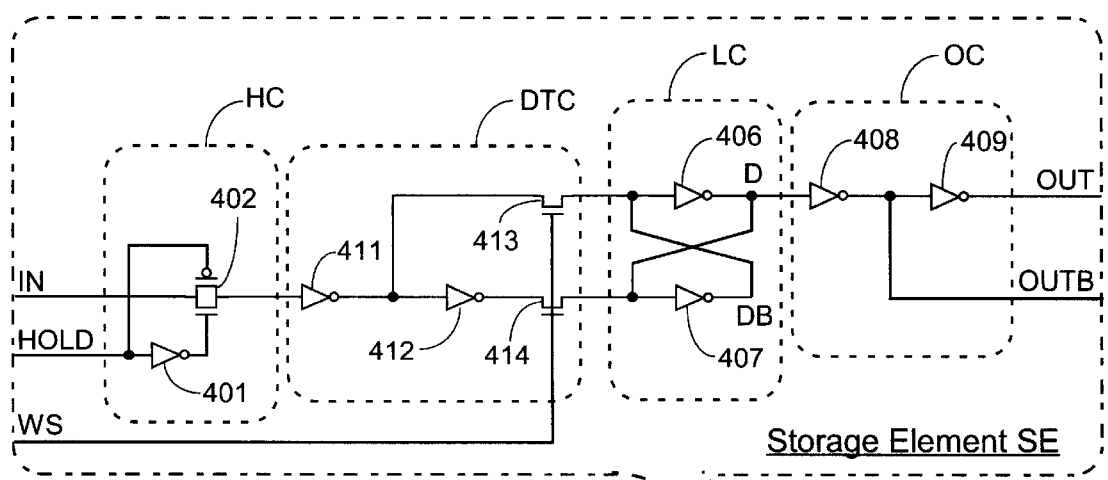
FIG. 4 is a schematic diagram of a CLB including a first storage element clocked by a write strobe pulse, according to a first embodiment of the invention.
Figure 4:
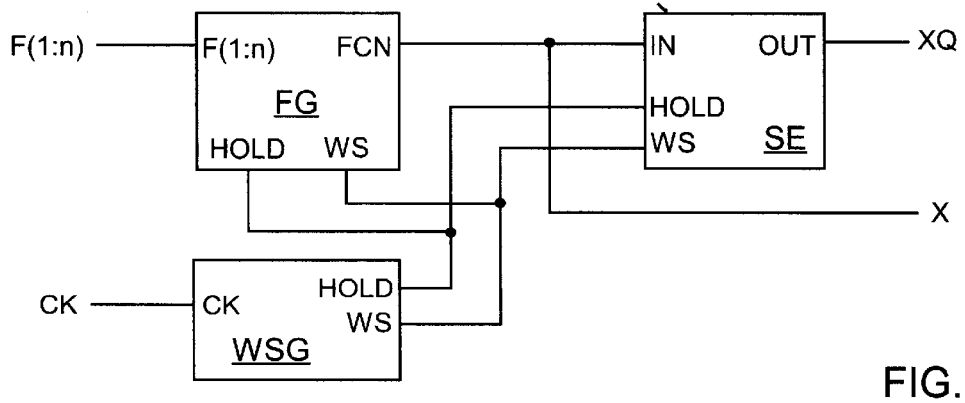

FIG. 4 is a schematic diagram of a configurable logic block (CLB) according to a first embodiment of the invention. The CLB of FIG. 4 includes a function generator FG, a write strobe generator WSG, and a storage element SE. Write strobe generator WSG provides hold and write strobe signals to function generator FG and to storage element SE. Storage element SE is also driven by the function generator output signal FCN. In another embodiment (not shown), hold circuit HC and hold signal HOLD are omitted.

Figure 1:
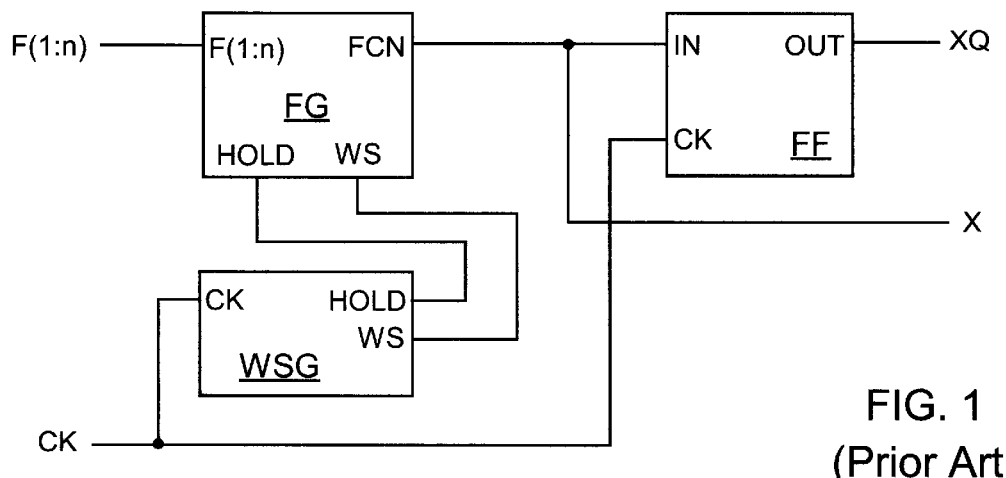
FIG. 1 is a simplified block diagram of a prior art configurable logic block (CLB) in a programmable logic device (PLD).
Figure 2:
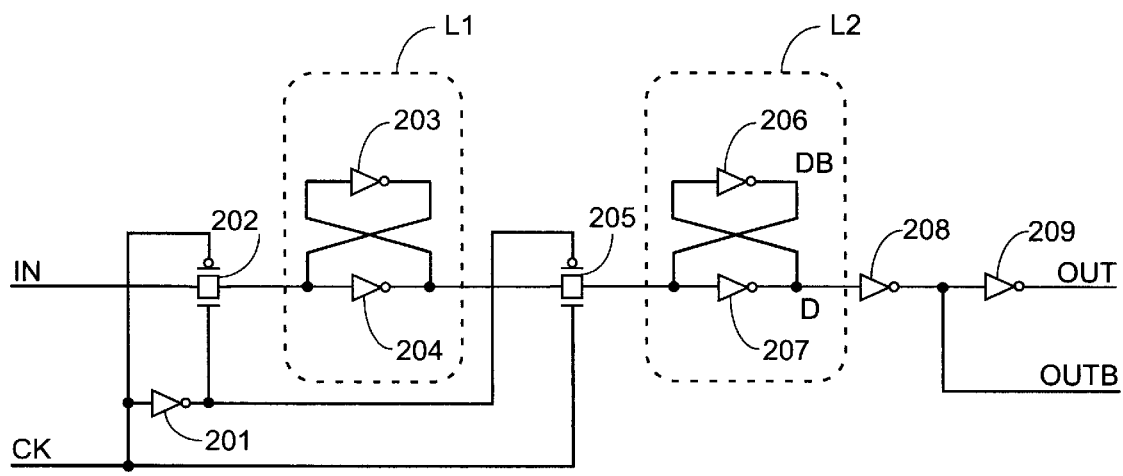
FIG. 2 is a schematic diagram of a first prior art flip-flop compatible with the CLB of FIG. 1.
Figure 3:
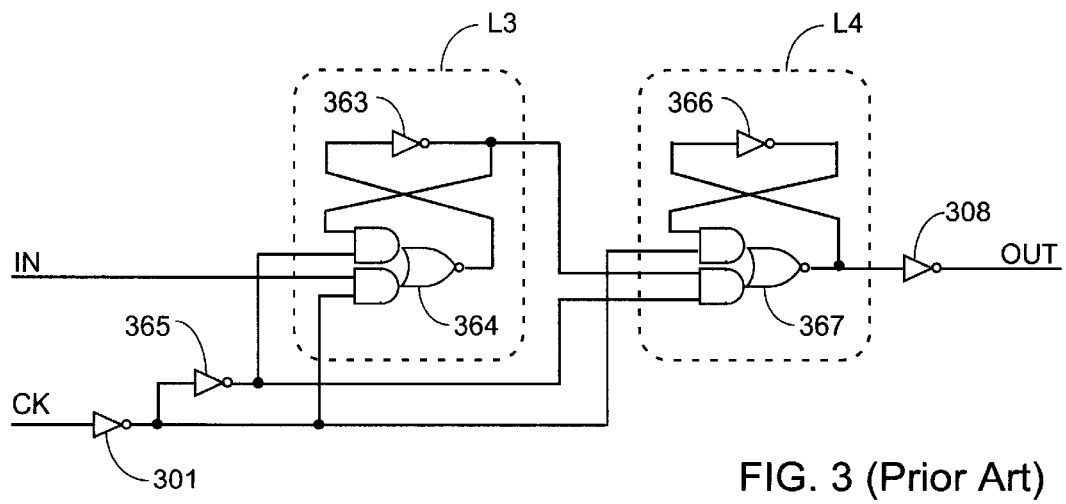
FIG. 3 is a schematic diagram of a second prior art flip-flop compatible with the CLB of FIG. 1.

Function generator FG and write strobe generator WSG in FIG. 4 can be similar to those shown and described with reference to FIG. 1. Indeed, the fact that the same implementations of these two blocks can be used provides an advantage to some embodiments of the invention, as no redesign or additional logic is required to generate the hold and write strobe pulses used by storage element SE. This is particularly true when care is taken in the design of storage element SE to ensure the storage element SE has similar timing requirements to function generator FG in RAM mode.

FIG. 4 also illustrates one implementation of storage element SE. The storage element implementation shown in FIG. 4 includes a hold circuit HC, a data transfer circuit DTC, a latch circuit LC, and an output circuit OC.

Hold circuit HC includes a passgate 402 coupled between a data input terminal IN and inverter 411 in data transfer circuit DTC. Passgate 402 has a P-channel gate terminal driven by a HOLD signal, and an N-channel gate terminal driven by the inverse of the HOLD signal (inverted in inverter 401).

Data transfer circuit DTC includes two inverters 411 and 412 coupled in series. The outputs of inverters 411 and 412 are passed by N-channel transistors 413 and 414, respectively, to inverters 406 and 407, respectively, of latch circuit LC. Transistors 413 and 414 each have a gate terminal driven by a write strobe (WS) signal.

Latch circuit LC includes two cross-coupled inverters 406 and 407. The output of inverter 406 is latched data signal D; the output of inverter 407 is latched inverted data signal DB. Either of the two data signals can be used to provide the output signals OUT and OUTB for the storage element. In the pictured embodiment, latched data signal D drives inverter 408 to provide inverted output signal OUTB, which in turn drives inverter 409 to provide output signal OUT.

Storage element SE of FIG. 4 functions as follows. When writing a value to the storage element, an active edge occurs on input clock signal CK. In response, write strobe generator WSG drives both the HOLD signal and write strobe signal WS high. A high value on the HOLD signal prevents any change on data input signal IN from being passed to the data transfer circuit. A high value on the write strobe signal WS allows the values from inverters 411 and 412 to be passed to latch circuit LC through transistors 413 and 414, respectively.

It is not very important which of signals HOLD and WS goes high first, because there is a hold time requirement on data input signal IN with respect to input clock signal CK. It is desirable for the HOLD signal to go high as soon as possible after an active edge on clock signal CK is received at the write strobe generator, to minimize this hold time requirement. It is also desirable for write strobe signal WS to go high as soon as possible to minimize the clock-to-out delay through the storage element. Therefore, each of signals HOLD and WS preferably goes high as soon as is reasonably possible after receipt of the active clock edge, given limitations such as available device area in the CLB.

Because complementary values are being passed to both nodes of latch circuit LC at the same time, the common problems with overwriting existing data are overcome. After sufficient time has elapsed for the latch circuit to change values, the write strobe signal WS goes low again, followed by the HOLD signal.

It is important that write strobe signal WS goes low (or inactive) before the HOLD signal does so. If the HOLD signal becomes inactive while write strobe signal WS is still passing data to latch circuit LC, new incoming data can overwrite the data just stored in the latch.

While storage element SE of FIG. 4 can be used in other situations, the circuit is of particular value in circumstances where the HOLD and write strobe WS signals are already available. This is particularly desirable because a write strobe generator can be complex to design, and can itself include one or more race conditions that must be taken into account. Further, a write strobe generator is generally larger than a storage element. One PLD having a CLB in which hold and write strobe signals are readily available is the Virtex FPC-A from Xilinx, Inc., which is described above in connection with FIG. 1.

In some embodiments, optional hold circuit HC and the HOLD signal are omitted. In these embodiments, the hold time requirement on data input signal IN with respect to input clock signal CK is increased to cover the time until write strobe signal WS becomes inactive. Therefore, embodiments including hold circuit HC and the HOLD signal are generally preferred.

One of the advantages of the storage element implementation of FIG. 4 is that it can be readily modified to provide set, reset, and initialization capability. FIGS. 5–9 show various other implementations of storage element SE that were created by modifying that circuit.

Figure 5:
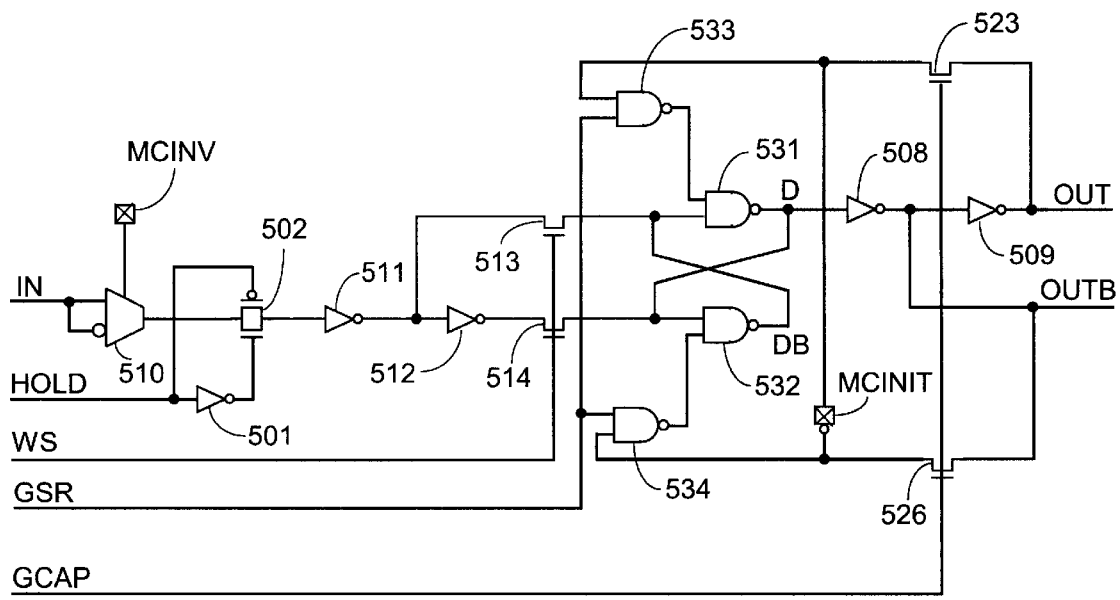
FIG. 5 is a schematic diagram of a second storage element compatible with the CLB of FIG. 4, according to a second embodiment of the invention.

FIG. 5 shows a storage element similar to that of FIG. 4, but modified to include several additional functions. The storage element implementation of FIG. 5 includes a programmable inversion function on the input path, an initialization function, and a capture function. The implementation shown in FIG. 5 is also compatible with the CLB of FIG. 4. As with the other implementations shown and described herein, no changes to the write strobe generator are necessary to accommodate the design changes to the storage element.

To avoid unnecessary repetition, portions of FIG. 5 and the remaining figures that are similar to those of FIG. 4 are not described.

The storage element of FIG. 5 includes a multiplexing circuit 510 controlled by a memory element MCINV. In one embodiment, memory element MCINV is a configuration memory cell. A value stored in memory element MCINV selects either the true or the complement value of the data input signal on data input terminal IN.

The storage element of FIG. 5 also includes an initialization circuit that includes memory element MCINIT and NAND gates 533 and 534. An initialization value for the storage element is stored in memory element MCINIT, which in one embodiment is a configuration memory cell for the PLD.

The latch circuit in this embodiment includes two cross-coupled NAND gates 531 and 532. When initialization signal GSR goes high, the true value from memory element MCINIT is passed through NAND gate 533 to NAND gate 531, and the complement value from memory element MCINIT is passed through NAND gate 534 to NAND gate 532. Whichever of the true or complement signals is high passes a low value to the corresponding NAND gate (either 531 or 532) in the latch circuit, thus writing the desired value into the latch circuit.

The storage element of FIG. 5 also includes a capture function that uses memory element MCINIT and transistors 523 and 526. When capture input signal GCAP goes high, the value on data output terminal OUT is stored in memory element MCINIT, with the true value being written from data output terminal OUT through transistor 523 and the complement value being written from inverse data output terminal OUTB through transistor 526.

In other embodiments having capture capability, only one of transistors 523 and 526 is included. However, in these embodiments, care must be taken to ensure that a high value passing through a transistor (e.g., transistor 523 or 526) can overwrite the value already stored in memory element MCINIT. Therefore, the capture circuit embodiment shown in FIG. 5 is preferred.

Figure 6:
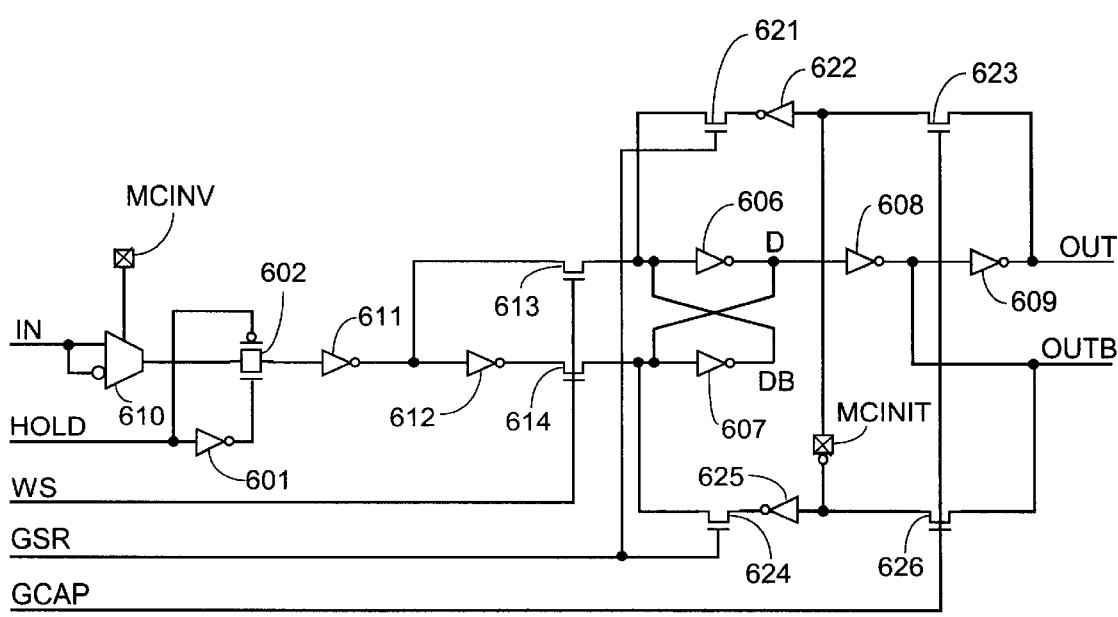
FIG. 6 is a schematic diagram of a third storage element compatible with the CLB of FIG. 4, according to a third embodiment of the invention.

FIG. 6 shows a third implementation of storage element SE that is compatible with the CLB of FIG. 4. The storage element of FIG. 6 has the same capabilities as the storage element of FIG. 5. In the circuit of FIG. 6, the latch circuit is implemented as two cross-coupled inverters 606 and 607, as in the implementation of FIG. 4. The initialization circuit is also implemented differently from in FIG. 5, in that transistors 621 and 624 are used to pass the initialization values (inverted by inverters 622 and 625, respectively) to the input terminals of the latch circuit.

Figure 7:
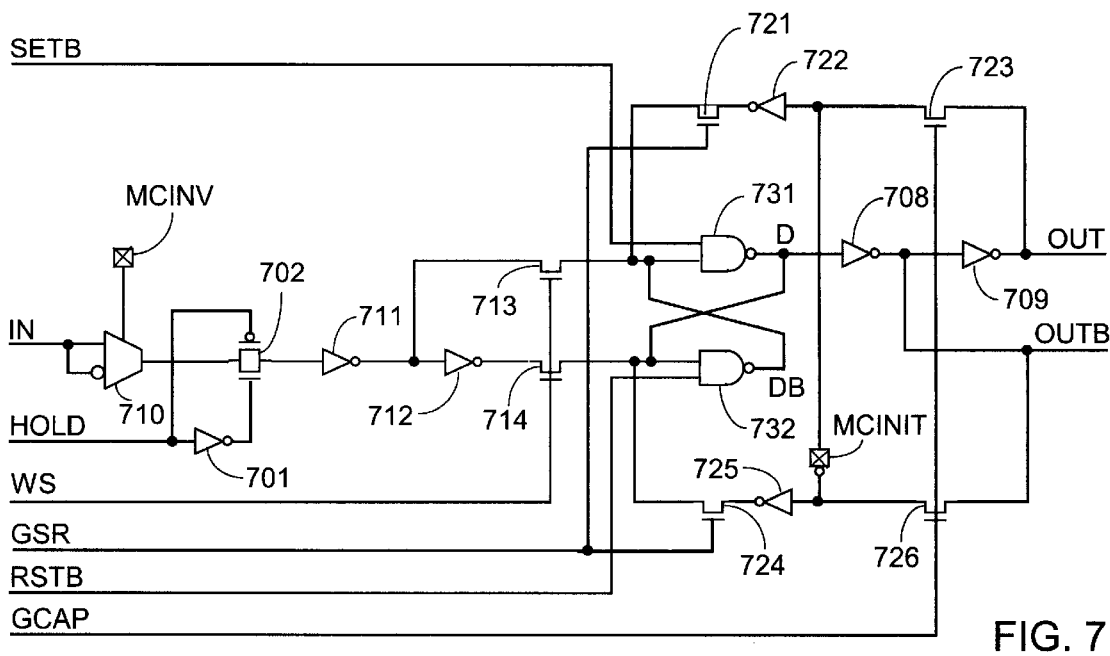
FIG. 7 is a schematic diagram of a fourth storage element compatible with the CLB of FIG. 4, according to a fourth embodiment of the invention.

FIG. 7 shows a fourth implementation of storage element SE that is compatible with the CLB of FIG. 4. The storage element shown in FIG. 7 is similar to that of FIG. 6, but with added set and reset circuits. To accommodate the set and reset functionality, the inverters in the latch circuit have been replaced by NAND gates 731 and 732. The second input to NAND gate 731 comes from an active-low set signal SETB. When set signal SETB goes low, the output of NAND gate 731 (latched data signal D) is forced high. If reset signal RSTB is high (e.g., if the set and reset signals are mutually exclusive, a common requirement in storage element design), then the output of NAND gate 732 (latched inverse data signal DB) goes low, and the latch has been set.

Similarly, the second input to NAND gate 732 comes from an active-low reset signal RSTB. When reset signal RSTB goes low, the output of NAND gate 732 (latched inverse data signal DB) is forced high. If set signal SETB is high (e.g., if the set and reset signals are mutually exclusive), then the output of NAND gate 731 (latched data signal D) goes low, and the latch has been reset.

In some embodiments, to avoid potential conflicts between the set and reset signals SETB and RSTB, these signals are mutually exclusive, as described above. In other embodiments, such as that of FIG. 7, the set signal takes precedence over the reset signal, so these signals need not be mutually exclusive. In yet other embodiments, the output signal is taken from node DB instead of node D (and appropriate polarity changes are made on the output path) to give the reset signal precedence over the set signal.

In the storage element implementation of FIG. 7, as well as in the other implementations shown herein, each of set and reset signals SETB and RSTB is mutually exclusive with the write strobe signal WS. (For example, an active hold signal inhibits the set and reset signals, and vice versa.) This restriction avoids potential conflicts between a new value written by the write strobe signal and an opposing new value dictated by a set or reset signal.

Figure 8:
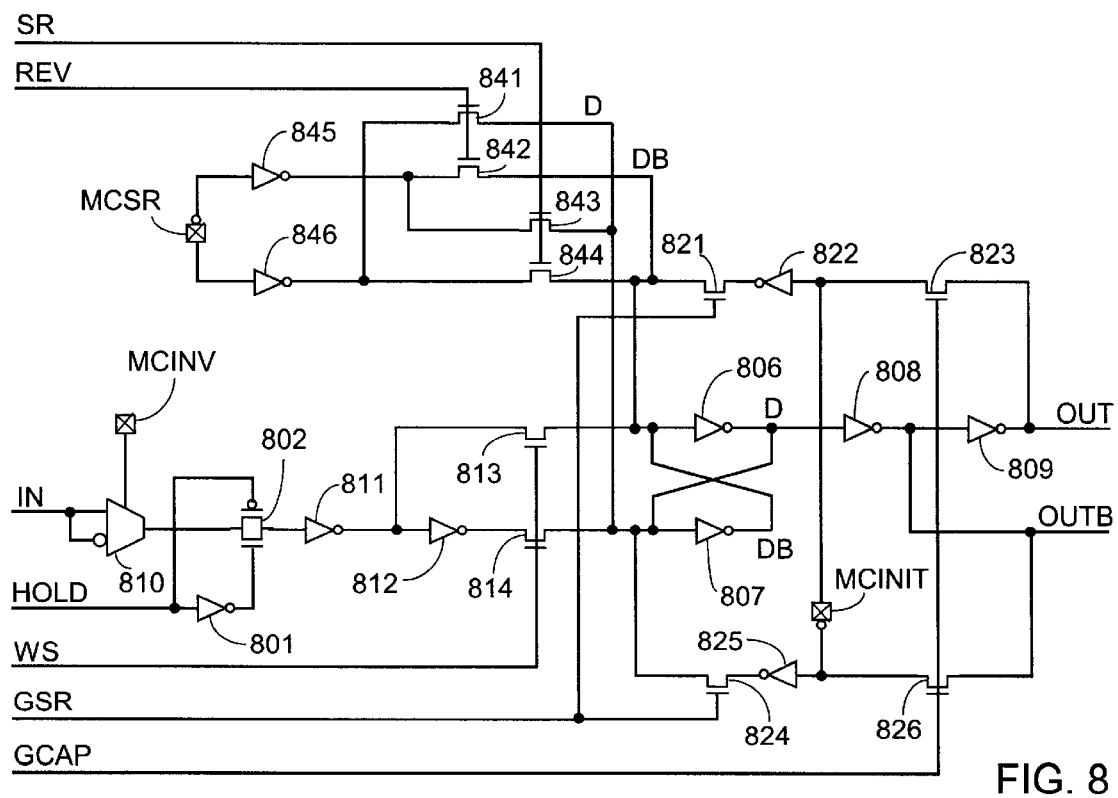
FIG. 8 is a schematic diagram of a fifth storage element compatible with the CLB of FIG. 4, according to a fifth embodiment of the invention.

FIG. 8 shows a fifth implementation of storage element SE that is compatible with the CLB of FIG. 4. The storage element shown in FIG. 8 is also similar to that of FIG. 6, but with added set and reset capability. However, the set and reset circuits are implemented differently than in the embodiment of FIG. 7.

In FIG. 8, the set and reset functions are controlled using a value stored in a memory element MCSR. If the value stored in memory element MCSR is high, the storage element will set when input signal SR goes high, and reset when reverse input signal REV goes high. (Input signals SR and REV are mutually exclusive.) If the value stored in memory element MCSR is low, the storage element will reset when set/reset input signal SR goes high, and set when reverse input signal REV goes high.

The true signal from memory element MCSR drives inverter 846, which passes through N-channel transistor 841 to latched data signal D and through N-channel transistor 844 to latched inverse data signal DB. The complement signal from memory element MCSR drives inverter 845, which passes through N-channel transistor 842 to latched inverse data signal DB and through N-channel transistor 843 to latched data signal D. Transistors 843 and 844 are gated by set/reset input signal SR. Transistors 841 and 842 are gated by reverse input signal REV.

In one embodiment, memory element MCSR is a configuration memory cell of the PLD.

Figure 9:
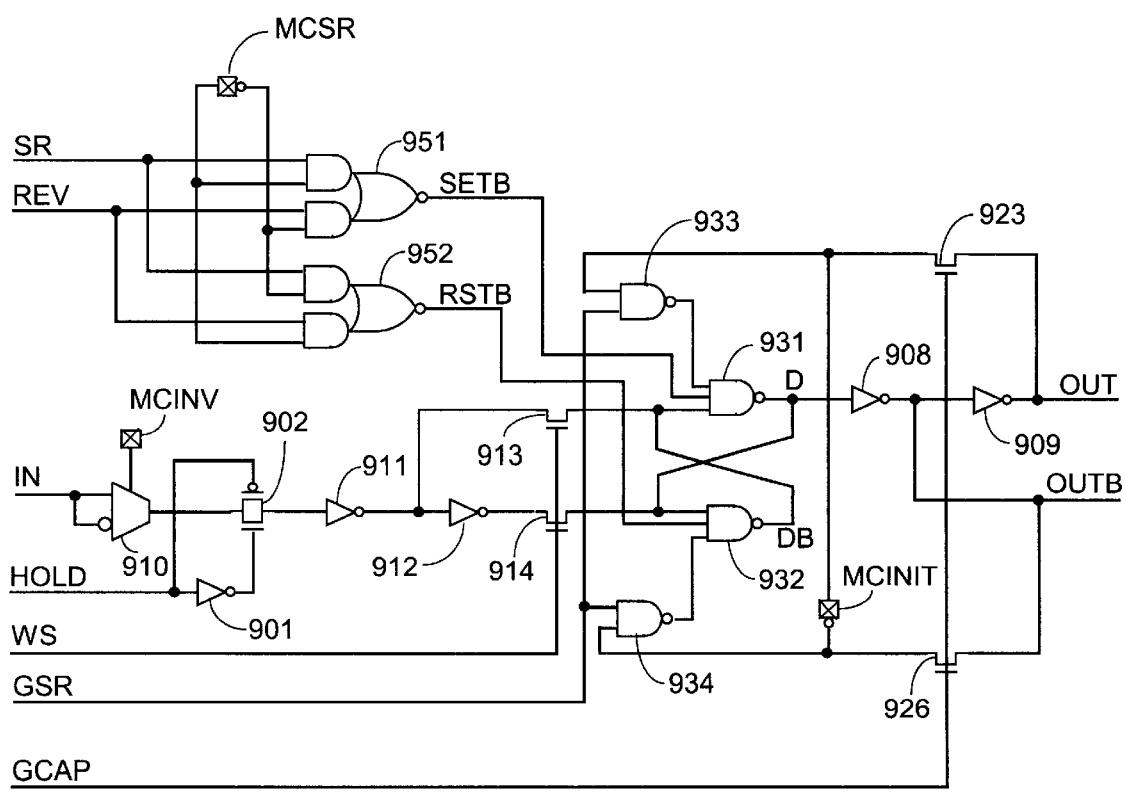
FIG. 9 is a schematic diagram of a sixth storage element compatible with the CLB of FIG. 4, according to a sixth embodiment of the invention.

FIG. 9 shows a sixth implementation of storage element SE that is compatible with the CLB of FIG. 4. The storage element shown in FIG. 9 has the same functionality as the circuit shown in FIG. 8. However, the embodiment of FIG. 9 takes considerably more area to implement than the embodiment of FIG. 8, because of the large logic gates implementing the set and reset circuits.

In the storage element implementation of FIG. 9, memory element MCSR is still used to control the set and reset circuitry, which behaves the same way as in the embodiment of FIG. 8. If the value stored in memory element MCSR is high, the storage element will set when input signal SR goes high, and reset when reverse input signal REV goes high. If the value stored in memory element MCSR is low, the storage element will reset when set/reset input signal SR goes high, and set when reverse input signal REV goes high.

The set and reset circuitry in FIG. 9 includes two AND/OR gates 951 and 952. AND/OR gate 951 ANDs together set/reset input signal SR and the true value from memory element MCSR, and also ANDs together reverse input signal REV and the complement value from memory element MCSR, and ORs together the two AND values to provide active-low set signal SETB. Active-low set signal SETB provides a third input signal to NAND gate 931.

Similarly, AND/OR gate 952 ANDs together set/reset input signal SR and the complement value from memory element MCSR, and also ANDs together reverse input signal REV and the true value from memory element MCSR, and ORs together the two AND values to provide active-low reset signal RSTB. Active-low reset signal RSTB provides a third input signal to NAND gate 932.

Figure 10:
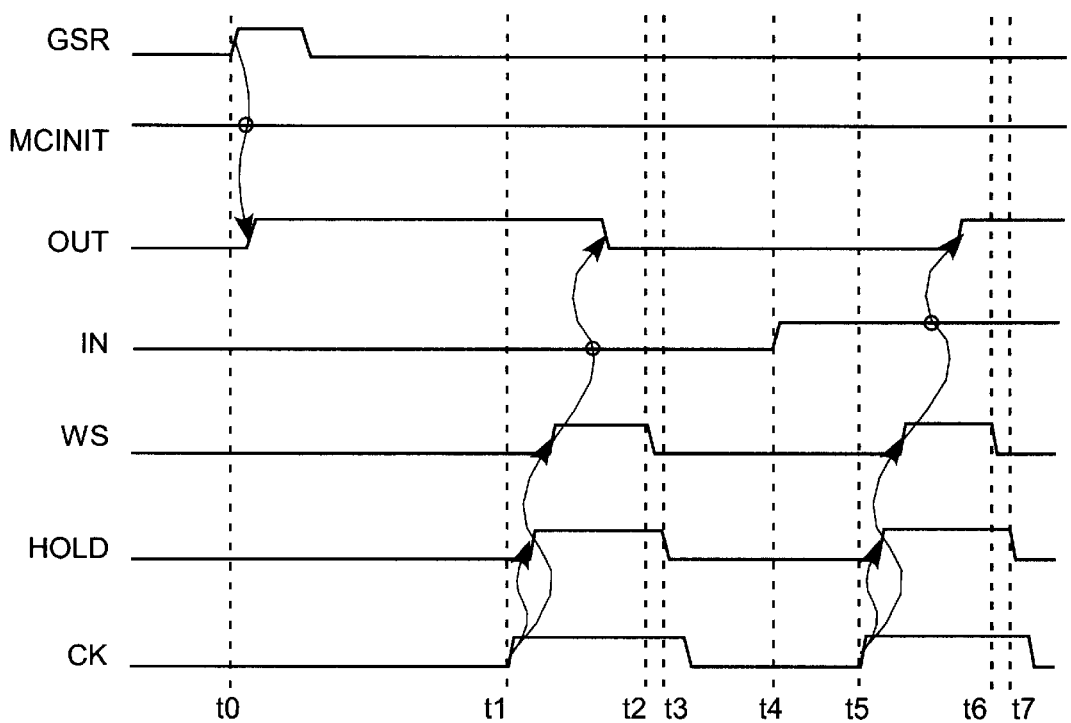
FIG. 10 is a first timing diagram showing successive initialization, write low, and write high processes for the CLB of FIG. 4 using the storage element implementations of FIGS. 8 and 9.

FIG. 10 provides a first timing diagram for the storage element implementations of FIGS. 8 and 9 applied to the CLB of FIG. 4. (Because the two embodiments have the same functionality, the timing diagrams shown in FIGS. 10 and 11 apply equally well to either embodiment.) In FIG. 10, it is assumed that input signals SR, REV, and GCAP are all low (i.e., no set, reset, or capture takes place). FIG. 10 demonstrates an initialization of the storage element to a high value, followed by writing first a zero and then a one value.

At time t0 in FIG. 10, initialization signal GSR goes high. Because a high value is stored in memory element MCINIT, the value stored in the storage element is initialized to one, i.e., output signal OUT goes high.

At time t1, clock signal CK (the input signal to write strobe generator WSG) goes high. In response, write strobe generator WSG drives the HOLD input signal and the write strobe signal WS high. When write strobe signal WS goes high, because data input signal IN is low, output signal OUT also goes low.

Write strobe signal WS then goes low at time t2, followed by the HOLD input signal at time t3. As described above with reference to FIG. 4, the order of the HOLD and WS signals going low can be important to proper circuit functionality.

At time t4, data input signal IN goes high. However, because write strobe signal WS is low, the change in data input signal IN is not passed to the latch circuit.

At time t5, clock signal CK goes high again, causing the HOLD signal and write strobe signal WS to follow suit. Because data input signal IN is high, output signal OUT also goes high. Write strobe signal WS then goes low at time t6, followed by the HOLD input signal at time t7.

Figure 11:
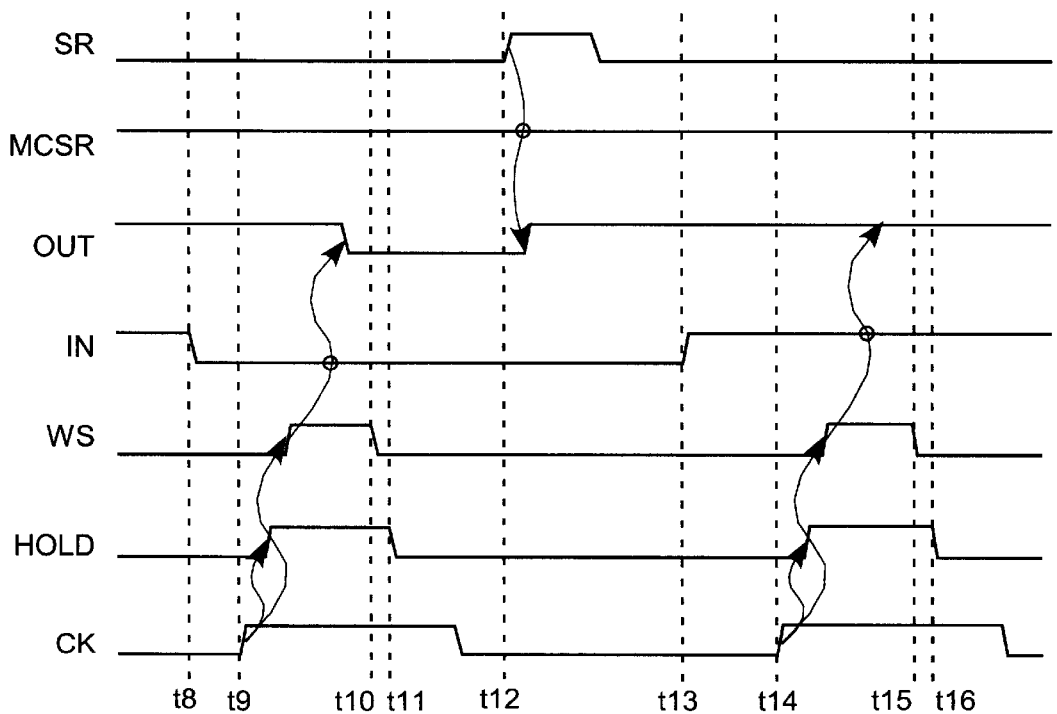
FIG. 11 is a second timing diagram showing successive write low, set, and write high processes for the CLB of FIG. 4 using the storage element implementations of FIGS. 8 and 9.

FIG. 11 provides a second timing diagram for the embodiment of FIG. 4 using the storage element implementations of FIGS. 8 and 9. In FIG. 11, it is assumed that input signals GSR, REV, and GCAP are all low (i.e., no initialization, reset, or capture takes place). FIG. 11 demonstrates writing a zero value, setting the storage element, and then writing a one value to the storage element.

At time t8, data input signal IN goes low. However, because write strobe signal WS is low, the change in data input signal IN is not passed to the latch circuit.

At time t9, clock signal CK goes high again, causing the HOLD signal and write strobe signal WS to go high. Because data input signal IN is low, output signal OUT also goes low. Write strobe signal WS then goes low at time t10, followed by the HOLD input signal at time t11.

At time t12, set/reset signal SR goes high. Because a high value is stored in memory element MCSR, a high value on set/reset signal SR causes the storage element to set. Thus, the value stored in the storage element is set to one, i.e., output signal OUT goes high again.

At time t13, data input signal IN goes high. However, because write strobe signal WS is low, the change in data. input signal IN is not passed to the latch circuit.

At time t14, clock signal CK goes high again, causing the HOLD signal and write strobe signal WS to go high. Because data input signal IN is high, output signal OUT does not change state (being already high). write strobe signal WS then goes low at time t15, followed by the HOLD input signal at time t16.

Those having skill in the relevant arts of the invention will now perceive various modifications and additions that can be made as a result of the disclosure herein. For example, passgates, transistors, inverters, NAND gates, NOR gates, logic gates, memory elements, configuration memory cells, multiplexers, multiplexing circuits, hold circuits, data transfer circuits, latch circuits, set circuits, reset circuits, initialization circuits, output circuits, storage elements, and other components other than those described herein can be used to implement the invention.

Moreover, some components are shown directly connected to one another while others are shown connected via intermediate components. In each instance, the method of interconnection establishes some desired electrical communication between two or more circuit nodes. Such communication may often be accomplished using a number of circuit configurations, as will be understood by those of skill in the art.

Further, the exemplary circuit implementations shown and described herein are controlled by signals having a given polarity. For example, the exemplary circuits use active-high control signals such as HOLD, WS, GSR, and GCAP, and active-low control signals such as SETB and RSTB. The modification of circuits to use control signals of opposite polarity is well understood by those of skill in the art.

Accordingly, all such modifications and additions are deemed to be within the scope of the invention, which is to be limited only by the appended claims and their equivalents.

What is claimed is:

1. A configurable logic block (CLB) for a programmable logic device (PLD), the CLB comprising:
    a function generator having a plurality of function generator input terminals, a write strobe input terminal, and an output terminal;
    a write strobe generator having a clock input terminal and a write strobe output terminal coupled to the write strobe input terminal of the function generator; and
    a storage element having a data input terminal coupled to the output terminal of the function generator, a write strobe input terminal coupled to the write strobe output terminal of the write strobe generator, and a data output terminal.

2. The CLB of claim 1, wherein:
    the function generator further has a hold input terminal;
    the write strobe generator further has a hold output terminal coupled to the hold input terminal of the function generator; and
    the storage element further has a hold input terminal coupled to the hold output terminal of the write strobe generator.

3. The CLB of claim 1, wherein the storage element comprises;
    an internal node coupled to the data input terminal of the storage element;
    a latch circuit having first and second latch input terminals and first and second latch output terminals, one of the first and second latch output terminals being coupled to the data output terminal of the storage element; and
    a data transfer circuit coupled between the internal node and the first and second latch input terminals, the data transfer circuit having a control terminal coupled to the write strobe input terminal.

4. The CLB of claim 3, the storage element further comprising:
    an output circuit coupled between the one of the first and second latch output terminals and the data output terminal of the storage element.

5. The CLB of claim 3, wherein the latch circuit comprises first and second cross-coupled inverters.

6. The CLB of claim 3, the storage element further comprising:
    a set circuit coupled to the latch circuit.

7. The CLB of claim 3, the storage element further comprising:
    a reset circuit coupled to the latch circuit.

8. The CLB of claim 3, wherein the latch circuit comprises first and second cross-coupled NAND gates, the storage element further comprising:
    a reset circuit coupled to an input terminal of the first NAND gate; and
    a set circuit coupled to an input terminal of the second NAND gate.

9. The CLB of claim 3, the storage element further comprising:
    an initialization circuit coupled to the latch circuit.

10. The CLB of claim 9, wherein:
    the latch circuit comprises first and second cross-coupled logic gates; and
    the initialization circuit is coupled to input terminals of the first and second logic gates.

11. The CLB of claim 9, the storage element further comprising set and reset circuits coupled to the latch circuit, wherein:
    the latch circuit comprises first and second cross-coupled logic gates, the reset circuit being coupled to an input terminal of the first logic gate and the set circuit being coupled to an input terminal of the second logic gate; and
    the initialization circuit is coupled to input terminals of the set and reset circuits.

12. The CLB of claim 9, the storage element further comprising:
    a capture circuit coupled to the data output terminal of the storage element and further coupled to the initialization circuit.

13. The CLB of claim 9, wherein:
    the initialization circuit includes a configuration memory cell for the PLD wherein an initialization value for the latch circuit is stored.

14. The CLB of claim 3, the storage element further comprising:
    a programmable input inversion circuit coupled between the data input terminal and the data transfer circuit, the input inversion circuit comprising a multiplexer circuit programmably selecting between inverted and non-inverted versions of a signal on the data input terminal.

15. A configurable logic block (CLB) for a programmable logic device (PLD), the CLB comprising:
    a function generator having a plurality of function generator input terminals, a write strobe input terminal, and an output terminal;
    a write strobe generator having a clock input terminal and a write strobe output terminal coupled to the write strobe input terminal of the function generator; and
    a storage element, the storage element comprising:
        a data input terminal coupled to the output terminal of the function generator;
        a write strobe input terminal coupled to the write strobe output terminal of the write strobe generator;
        a data output terminal;
        first and second inverters, wherein an input terminal of the first inverter is coupled to the data input terminal and an output terminal of the first inverter is coupled to an input terminal of the second inverter;

first and second logic gates, wherein the first and second logic gates are cross-coupled, an output terminal of one of the first and second logic gates being coupled to the data output terminal;

a first transistor coupled between the output terminal of the first inverter and an input terminal of the second logic gate, the first transistor having a gate terminal coupled to the write strobe input terminal; and a second transistor coupled between the output terminal of the second inverter and an input terminal of the first logic gate, the second transistor having a gate terminal coupled to the write strobe input terminal.

16. The CLB of claim 15, wherein:
the function generator further has a hold input terminal;
the write strobe generator further has a hold output terminal coupled to the hold input terminal of the function generator;
the storage element further comprises a hold input terminal coupled to the hold output terminal of the write strobe generator; and
the storage element further comprises a passgate coupled between the data input terminal and an input terminal of the first inverter, a gate terminal of the passgate being coupled to the hold input terminal of the storage element.

17. The CLB of claim 15, the storage element further comprising:
a third inverter coupled between the output terminal of the one of the first and second logic gates and the data output terminal of the storage element.

18. The CLB of claim 15, wherein the first and second logic gates are inverters.

19. The CLB of claim 15, wherein the second logic gate comprises a NAND gate, the storage element further comprising:
a set input terminal coupled to an input terminal of the second logic gate.

20. The CLB of claim 15, wherein the first logic gate comprises a NAND gate, the storage element further comprising:
a reset input terminal coupled to an input terminal of the first logic gate.

21. The CLB of claim 15, the storage element further comprising:
an initialization input terminal;
a memory element storing an initialization value for the storage element, the memory element having true and complement terminals;
a third transistor coupled between the true terminal of the memory element and the input terminal of the second logic gate, the third transistor having a gate terminal coupled to the initialization input terminal; and
a fourth transistor coupled between the complement terminal of the memory element and the input terminal of the first logic gate, the fourth transistor having a gate terminal coupled to the initialization input terminal.

22. The CLB of claim 21, the storage element further comprising:
a capture input terminal; and
a fifth transistor coupled between the data output terminal of the storage element and one of the true and complement terminals of the memory element, the fifth transistor having a gate terminal coupled to the capture input terminal.

23. The CLB of claim 21, wherein:
the memory element comprises a configuration memory cell of the PLD.

24. The CLB of claim 15, the storage element further comprising:
an initialization input terminal;
a memory element storing an initialization value for the storage element, the memory element having true and complement terminals;
a third transistor coupled between the true terminal of the memory element and a second input terminal of the second logic gate, the third transistor having a gate terminal coupled to the initialization input terminal; and
a fourth transistor coupled between the complement terminal of the memory element and a second input terminal of the first logic gate, the fourth transistor having a gate terminal coupled to the initialization input terminal.

25. The CLB of claim 24, the storage element further comprising:
a capture input terminal; and
a fifth transistor coupled between the data output terminal of the storage element and one of the true and complement terminals of the memory element, the fifth transistor having a gate terminal coupled to the capture input terminal.

26. The CLB of claim 24, wherein: the memory element comprises a configuration memory cell of the PLD.

27. The CLB of claim 15, the storage element further comprising:
a multiplexer circuit coupled between the data input terminal and the passgate, the multiplexer circuit programmably selecting between inverted and non-inverted versions of a signal on the data input terminal.

28. A configurable logic block (CLB) for a programmable logic device (PLD), the CLB comprising:
a function generator having a plurality of function generator input terminals, a write strobe input terminal, and an output terminal;
a write strobe generator having a clock input terminal and a write strobe output terminal coupled to the write strobe input terminal of the function generator; and
a storage element, the storage element comprising:
a data input terminal coupled to the output terminal of the function generator;
a write strobe input terminal coupled to the write strobe output terminal of the write strobe generator;
a data output terminal;
an internal node coupled to the data input terminal of the storage element;
a latch circuit having first and second latch input terminals and first and second latch output terminals, one of the first and second latch output terminals being coupled to the data output terminal of the storage element; and
means for passing a data input value on the internal node to the first latch input terminal and an inverse of the data input value on the internal node to the second latch input terminal when a signal on the write strobe input terminal is in a first predetermined state.

29. The CLB of claim 28, wherein:
the function generator further has a hold input terminal;
the write strobe generator further has a hold output terminal coupled to the hold input terminal of the function generator;

the storage element further comprises a hold input terminal coupled to the hold output terminal of the write strobe generator; and the storage element further comprises means for passing a data input value on the data input terminal to the internal node when a signal on the hold input terminal is in a second predetermined state.

30. The CLB of claim 28, the storage element further comprising:

means for setting the latch circuit.

31. The CLB of claim 28, the storage element further comprising:

means for resetting the latch circuit.

32. The CLB of claim 28, the storage element further comprising:

means for initializing the latch circuit to a predetermined value.

33. The CLB of claim 32, the storage element further comprising:

means for capturing a value on the data output terminal of the storage element and storing the captured value in the means for initializing the latch circuit, wherein the captured value replaces the predetermined value.

34. A programmable logic device (PLD) comprising an array of configurable logic blocks (CLBs), each CLB comprising:

a programmable function generator having a plurality of function generator input terminals, a write strobe input terminal, and an output terminal, the programmable function generator comprising configuration memory cells for the PLD;

a write strobe generator having a clock input terminal and a write strobe output terminal coupled to the write strobe input terminal of the function generator; and a storage element having a data input terminal coupled to the output terminal of the function generator, a write strobe input terminal coupled to the write strobe output terminal of the write strobe generator, and a data output terminal.

* * * * *